(12) United States Patent
Lee et al.

(10) Patent No.: US 6,787,404 B1
(45) Date of Patent: Sep. 7, 2004

(54) METHOD OF FORMING DOUBLE-GATED SILICON-ON-INSULATOR (SOI) TRANSISTORS WITH REDUCED GATE TO SOURCE-DRAIN OVERLAP CAPACITANCE

(75) Inventors: Yong Meng Lee, Singapore (SG); Da Jin, Shang Hai (CN); David Vigar, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 43 days.

(21) Appl. No.: 10/664,262

(22) Filed: Sep. 17, 2003

(51) Int. Cl.$^7$ ............... H01L 21/00; H01L 21/331
(52) U.S. Cl. ............... 438/151; 438/164; 438/311; 438/337
(58) Field of Search ............... 438/151, 164, 438/311, 337

(56) References Cited

U.S. PATENT DOCUMENTS

| | | | |
|---|---|---|---|
| 6,365,465 B1 * | 4/2002 | Chan et al. | 438/283 |
| 6,396,108 B1 | 5/2002 | Krivokapic et al. | 257/365 |
| 6,413,802 B1 * | 7/2002 | Hu et al. | 438/151 |
| 6,451,656 B1 | 9/2002 | Yu et al. | 438/283 |

* cited by examiner

*Primary Examiner*—John F. Niebling
*Assistant Examiner*—Stanetta Isaac

(74) *Attorney, Agent, or Firm*—George O. Saile; Rosemary L. S. Pike; Stephen G. Stanton

(57) ABSTRACT

A method of forming a double-gated transistor comprising the following sequential steps. A substrate having an SOI structure formed thereover is provided. The SOI structure including a lower SOI oxide layer and an upper SOI silicon layer. The SOI silicon layer is patterned to form a patterned SOI silicon layer including a source region and a drain region connected by a channel portion. An encasing oxide layer is formed over the patterned SOI silicon layer to form an encased patterned SOI silicon layer. A patterned dummy layer is formed over the encased patterned SOI silicon layer. The patterned dummy layer having an opening, with exposed side walls, exposing: the channel portion of the encased patterned SOI silicon layer; and portions of the upper surface of the SOI oxide layer. Offset spacers are over the exposed side walls of the patterned dummy layer opening. The SOI oxide layer is etched while minimizing the undercut portions of the upper surface of the SOI oxide layer are undercut into the SOI oxide layer to form a minimal undercut. The minimizing undercutting process also removing the offset spacers and the encasing oxide layer over the channel portion of the patterned SOI silicon layer. A conformal oxide layer is formed around the channel portion of the patterned SOI silicon layer. A gate is formed within the patterned dummy layer opening. The gate including an upper gate above the patterned SOI silicon layer and a lower gate under the patterned SOI silicon layer. The patterned dummy layer is then removed to form the double-gated transistor.

49 Claims, 5 Drawing Sheets

METHOD OF FORMING DOUBLE-GATED SILICON-ON-INSULATOR (SOI) TRANSISTORS WITH REDUCED GATE TO SOURCE-DRAIN OVERLAP CAPACITANCE

FIELD OF THE INVENTION

The present invention relates generally to fabrication of semiconductor devices, and more specifically to methods of fabricating double-gated semiconductor-on-insulator-on-insulator (SOI) transistors.

BACKGROUND OF THE INVENTION

Double-gated transistors offer greater performance compared to conventional planar transistors. However, a problem has been how to fabricate such double-gated transistors. Current techniques being examined today include epitaxial growth to form the channel after gate oxidation and fin field effect transistors (FET) (so named "fin" as its appearance is that of a fish's fin). However, both of these techniques have significant limitations.

U.S. Pat. No. 6,451,656 B1 to Yu et al. describes a double-gate transistor on semiconductor-on-insulator (SOI).

U.S. Pat. No. 6,413,802 B1 to Hu et al. describes a double-gate FinFFET on semiconductor-on-insulator (SOI).

U.S. Pat. No. 6,365,465 B1 to Chan et al. also describes a process for a double-gate MOSFET on semiconductor-on-insulator (SOI).

U.S. Pat. No. 6,396,108 B1 to Krivokapic et al. describes a process for a double-gate MOSFET on semiconductor-on-insulator (SOI).

SUMMARY OF THE INVENTION

Accordingly, it is an object of the present invention to provide methods of forming double-gated silicon-on-insulator (SOI) transistors having reduced gate to source-drain overlap capacitance.

Other objects will appear hereinafter.

It has now been discovered that the above and other objects of the present invention may be accomplished in the following manner. Specifically, a substrate having an SOI structure formed thereover is provided. The SOI structure including a lower SOI oxide layer and an upper SOI silicon layer. The SOI silicon layer is patterned to form a patterned SOI silicon layer including a source region and a drain region connected by a channel portion. An encasing oxide layer is formed over the patterned SOI silicon layer to form an encased patterned SOI silicon layer. A patterned dummy layer is formed over the encased patterned SOI silicon layer. The patterned dummy layer having an opening, with exposed side walls, exposing: the channel portion of the encased patterned SOI silicon layer; and portions of the upper surface of the SOI oxide layer. Offset spacers are over the exposed side walls of the patterned dummy layer opening. The SOI oxide layer is etched while minimizing the undercut portions of the upper surface of the SOI oxide layer are undercut into the SOI oxide layer to form a minimal undercut. The minimizing undercutting process also removing the offset spacers and the encasing oxide layer over the channel portion of the patterned SOI silicon layer. A conformal oxide layer is formed around the channel portion of the patterned SOI silicon layer. A gate is formed within the patterned dummy layer opening. The gate including an upper gate above the patterned SOI silicon layer and a lower gate under the patterned SOI silicon layer. The patterned dummy layer is then removed to form the double-gated transistor.

BRIEF DESCRIPTION OF THE DRAWINGS

The features and advantages of the present invention will be more clearly understood from the following description taken in conjunction with the acompanying drawings in which like reference numerals designate similar or corresponding elements, regions and portions and in which.

DETAILED DESCRIPTION OF THE PREFERRED EMBODIMENTS

This invention provides an alternative way to fabricate double-gated transistors using a silicon-on-insulator (SOI) substrate as the starting material. Since the technique of the present invention uses the top and bottom sides of the SOI to form the gate, surface mobility is not degraded as in the case of fin FETs. The SOI transistors formed in accordance with the present invention have a reduced gate to source-drain overlap capacitance due to the offset spacer reducing the undercut.

Figure 1:
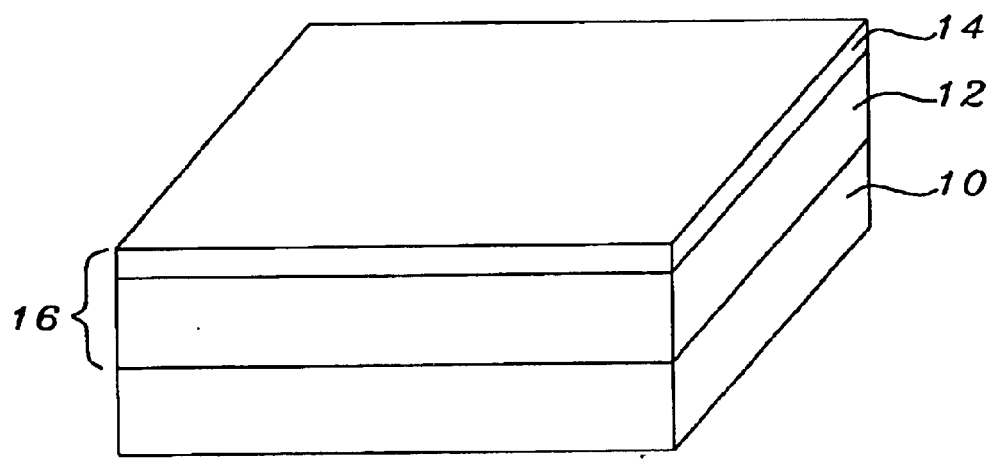
FIGS. 1 to 9 schematically illustrate a preferred embodiment of the present invention.

Initial Structure—FIG. 1

FIG. 1 schematically illustrates a structure 10 having a silicon-on-insulator structure (SOI) 16 formed thereover.

Structure 10 is preferably a semiconductor substrate comprised of silicon or germanium and is more preferably a silicon semiconductor substrate.

SOI 16 includes: a lower SOI silicon oxide ($SiO_2$) layer 12 having a thickness of preferably from about 1000 to 5000 Å and more preferably from about 2000 to 4000 Å; and an overlying SOI silicon (Si) layer 14 having a thickness of preferably from about 300 to 2000 Å and more preferably from about 500 to 1500 Å.

Figure 2:
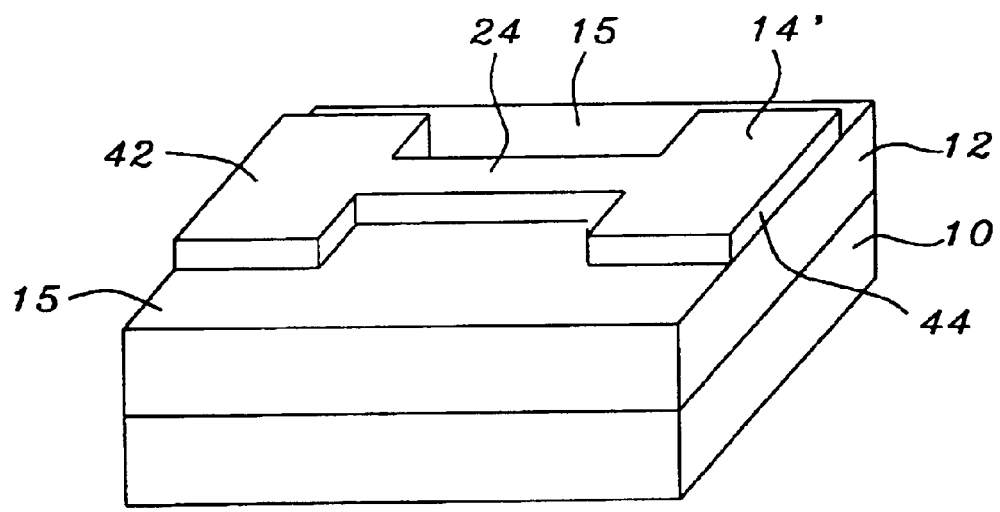

Patterning of Overlying SOI Si Layer 14—FIG. 2

As shown in FIG. 2, the overlying SOI silicon layer 14 of the SOI 16 is patterned to define patterned overlying SOI silicon layer 14', the active region as shown and exposed portions 15 of SOI silicon oxide layer 12. The overlying SOI silicon layer 14 may be patterned, for example, using an overlying patterned mask layer (not shown) preferably comprised of photoresist.

Patterned SOI silicon layer 14' is roughly in the shape of a dumbbell with the opposing ends being a source region 42 and drain region 44, respectively.

Figure 3:
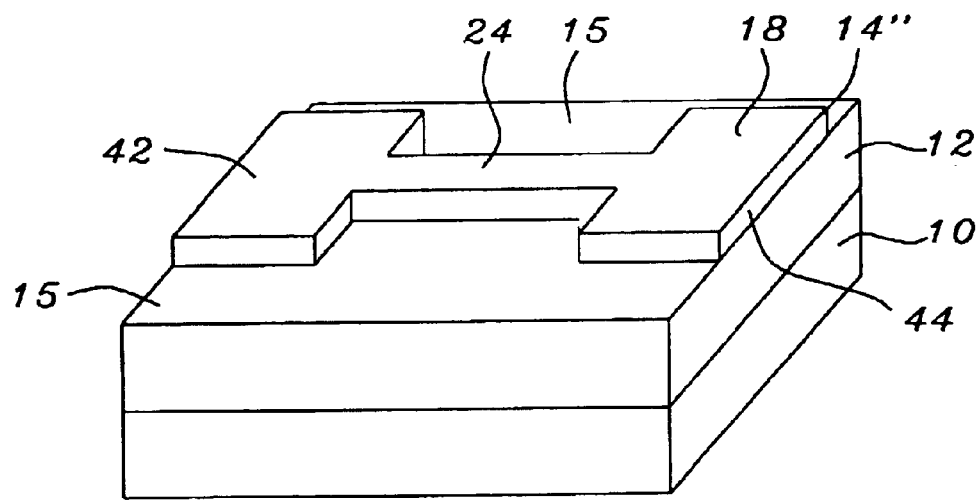

Formation of Encasing Silicon Oxide Layer 18 Over Patterned SOI Silicon Layer 14'—FIG. 3

As shown in FIG. 3, an encasing silicon oxide layer 18 is formed, preferably by growth, over the entire exposed surfaces of the patterned SOI silicon layer 14'0 to form an encased patterned SOI silicon layer 14". Encasing silicon oxide layer 18 is preferably from about 5 to 200 Å thick and is more preferably from about 10 to 50 Å.

Silicon oxide layer 18 serves to protect the patterned SOI silicon layer 14' from subsequent processing steps.

Figure 4:
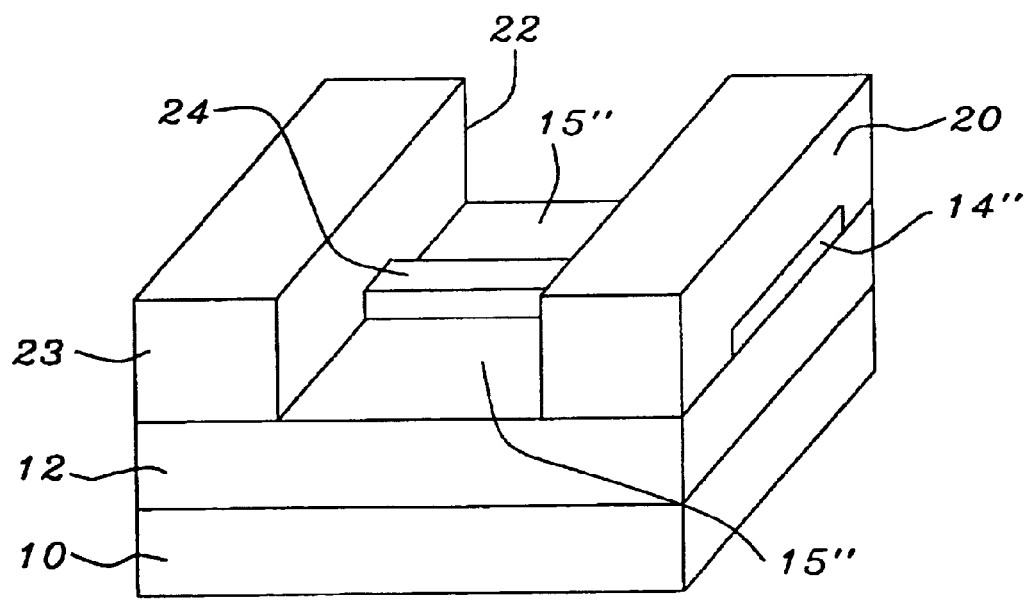

Formation of Patterned Dummy Layer 20—FIG. 4

As shown in FIG. 4, a patterned dummy layer 20 having an opening 22 is formed over the encased patterned SOI silicon layer 14" and the exposed portions 15' of the SOI silicon oxide layer 12. Patterned dummy layer opening 22 exposes: a gate/channel portion 24 of the encased patterned SOI silicon layer 14"; and reduced exposed portions 15" of SOI silicon oxide layer 12. Dummy layer opening 22 includes exposed side walls 23.

Dummy layer 20 has a thickness of preferably from about 1000 to 3000 Å and more preferably from about 1500 to 2500 Å; and is preferably comprised of nitride, silicon nitride ($Si_3N_4$) or silicon oxynitride (SiON) and is more preferably comprised of nitride as will be used hereafter for illustrative purposes.

Dummy nitride layer 20 may be patterned using, for example, a reverse mask and an anisotropic etch to open up the gate area. The anisotropic etch used to pattern dummy nitride layer 20 is selective to silicon oxide so that the patterned SOI silicon layer 14' within the encased patterned SOI silicon layer 14" exposed by opening 22 is protected from etch damage.

Figure 5:
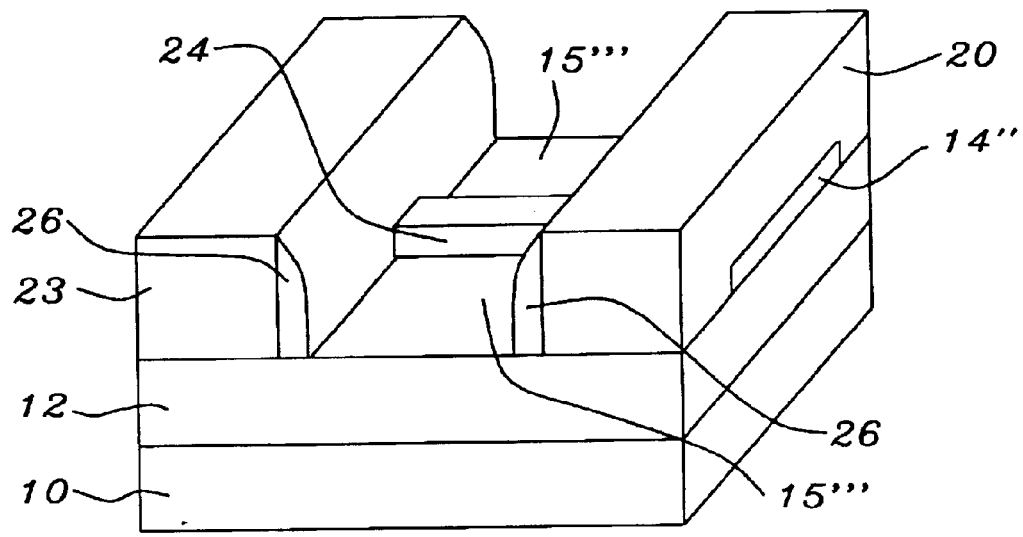

Formation of Offset Spacers 26—FIG. 5

As shown in FIG. 5, offset spacers 26 are then formed over the exposed side walls 23 of patterned nitride layer 20 within opening 22.

A spacer layer is formed over the structure of FIG. 4, at least filling opening 22, and is then etched with an etch selective to nitride and silicon to form the offset spacers 26. This etch also removes the portions of the oxide layer 18 encasing the patterned SOI silicon layer 14' exposed within opening 22 of the patterned dummy nitride layer 20.

The spacer layer is preferably comprised of TEOS, nitride or silicon oxynitride and is more preferably comprised of TEOS which will be used hereafter for purposes of illustration to form TEOS offset spacers 26.

It is noted that the offset spacers 26 so formed reduce the subsequent undercutting of SOI silicon oxide layer 12 which gives the formed double-gated SOI transistor 70 formed in accordance with the present invention a reduced gate to source-drain overlap capacitance.

Figure 6:
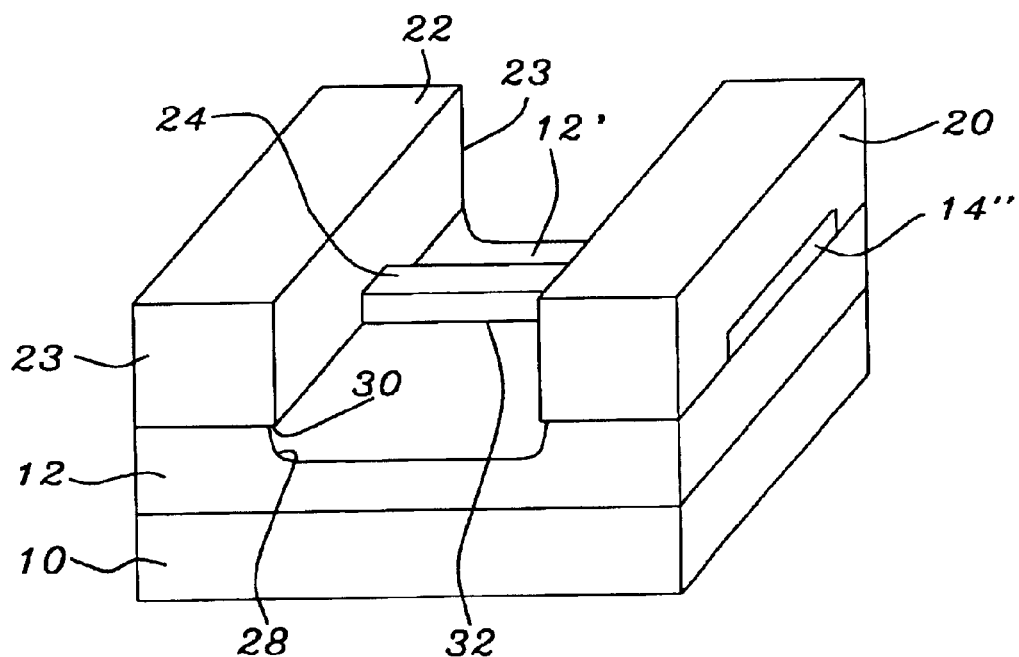

Etching of SOI Oxide Layer 12—FIG. 6

As shown in FIG. 6, an etch, preferably a dilute HF etch, is used to etch the SOI oxide layer 12 exposed within opening 22 which also undercuts the SOI oxide layer 12 shielded by the TEOS offset spacers 26 to form an undercut 28 within etched SOI oxide layer 12' below the silicon channel 24. The TEOS offset spacers 26 are also removed during the dilute HF etch.

Undercut 28 of the etched SOI oxide layer 12' is preferably from about 500 to 3000 Å and more preferably from about 1000 to 2000 Å deep and preferably protrudes from about 0 to 2000 Å and more preferably from about 0 to 500 Å under the leading edges of opening 22 of patterned dummy nitride layer 20.

It is noted that undercut 28 has a reduced overlap region 30 due to the formation and use of TEOS offset spacers 26.

Formation of Conformal Gate Oxide Layer 32—FIG. 6

As further shown in FIG. 6, a conformal layer 32 is formed, around the channel portion 24 of patterned SOI silicon layer 14' exposed within the opening 22 of the patterned dummy nitride layer 20. Conformal layer is preferably comprised of oxide formed by growth or a high-k material formed by chemical vapor deposition (CVD) (where the dielectric constant k if greater than about 3.0) such as, for example, $HfSi_xO_2$ or $ZrO_2$,. and is more preferably comprised of oxide which will be used hereafter for purposes of illustration.

Conformal oxide layer 32 is grown on the exposed top, bottom and sides of channel portion 24 of patterned SOI silicon layer 14' to a thickness of preferably from about 5 to 200 Å and more preferably from about 10 to 50 Å.

Figure 7:
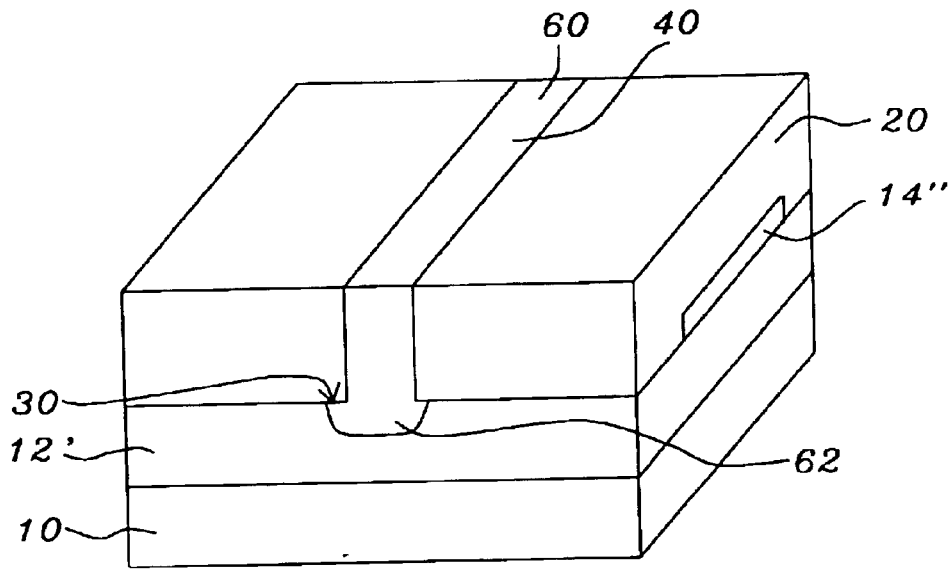

Formation of Gate 40—FIG. 7

As shown in FIG. 7, a gate layer is formed over patterned dummy nitride layer 20, filling opening 22 and may be planarized or etched back to remove the excess of the gate layer from over the top of patterned dummy nitride layer 20 to form a planarized gate 40 within opening 22. Gate 40 is preferably comprised of polysilicon (poly), tungsten (W), W—$Si_x$, SiGe or aluminum (Al) and is more preferably polysilicon (poly).

Figure 8:
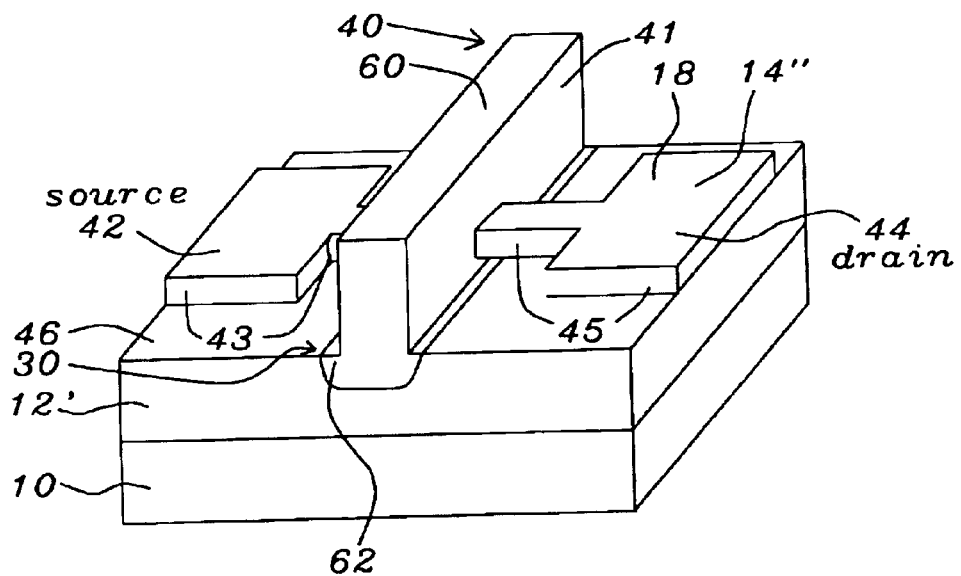
Figure 9:
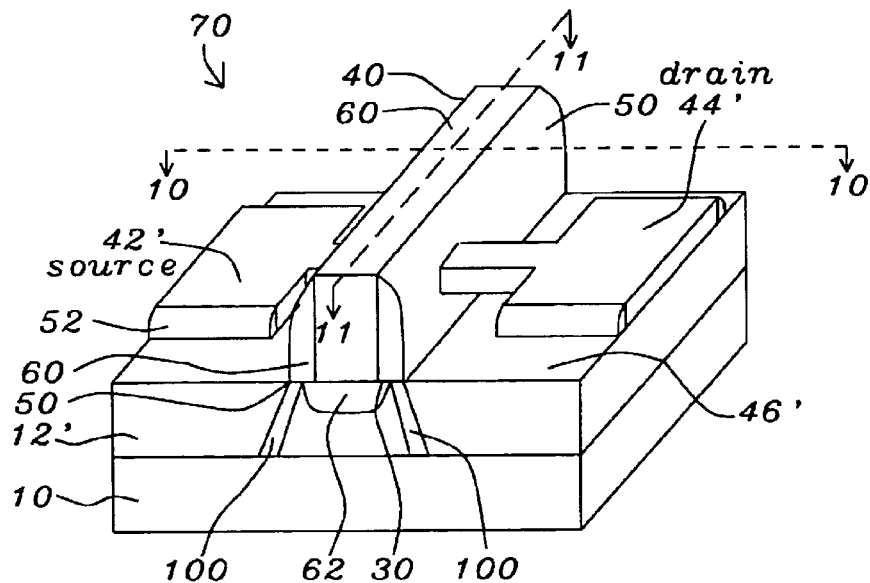
Figure 10:
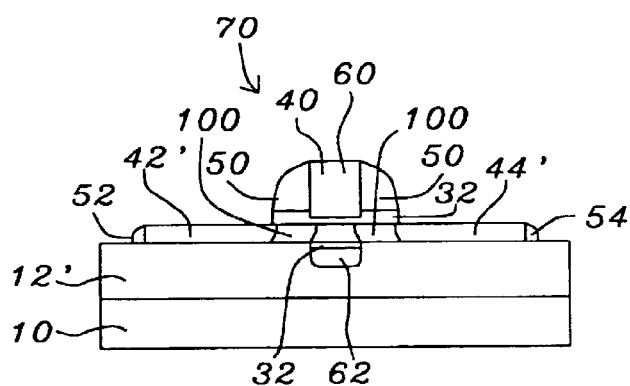
FIG. 10 is a cross-sectional view taken along line 10—10 of FIG. 9.
Figure 11:
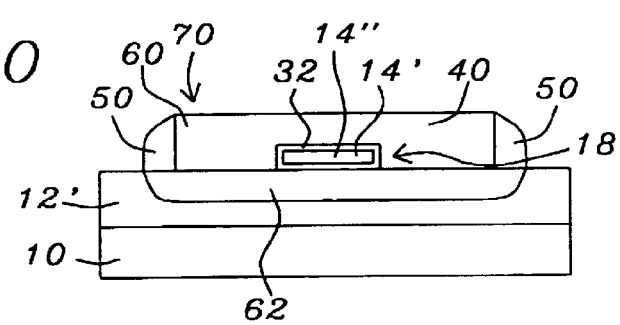
FIG. 11 is a cross-sectional view taken along line 11—11 of FIG. 9.

Gate 40 includes upper gate 60 and lower gate 62 separated by encased patterned SOI silicon layer 14" as shown in FIGS. 8 and 9 as well as in FIGS. 10 and 11.

Since polysilicon, for example, has good gap filling properties and the poly growth is conformal, poly gate 40 wraps completely around the conformal oxide layer 32 previously grown around the channel portion 24 of patterned SOI silicon layer 14' exposed within the opening 22 of the patterned dummy nitride layer 20.

If the gate layer is planarized, it is preferably by a chemical mechanical polishing (CMP) process.

Removal of the Patterned Dummy Nitride Layer 20—FIG. 8

As shown in FIG. 8, the patterned dummy nitride layer 20 is removed from the structure of FIG. 7 to expose: the side walls 41 of upper poly gate 60; source region 42 and drain region 44 of encased patterned SOI silicon layer 14"; and a portion 46 of the upper surface of the undercut SOI silicon oxide layer 12". The patterned dummy nitride layer 20 is preferably removed using hot phosphoric acid.

It is noted that the silicon oxide layer 18 formed over the patterned SOI silicon layer 14' is not removed at this point.

LDD Implantation. Formation of Spacers 50, 52 and Source-Drain Implants—FIG. 9

As shown in FIG. 9, conventional SDE or LDD implants 100 are performed and will exist under the spacers 50, 52 (see below) and overlap the gate by a small portion. The silicon substrate is thin enough such that the SDE/LDD extend from top to bottom of the Si substrate.

Spacers 50 are then formed over the sidewalls 41 of upper poly gate 60, and spacers 52, 54 are formed over the respective sidewalls 43, 45 of encased patterned SOI silicon layer 14" as shown in FIG. 9.

Source-drain (S/D) implants are then respectively formed into source region 42 and drain region 44, for example, to form source 42' and drain 44' to complete formation of double-gated transistor 70 having reduced overlap region 30.

Optionally, a standard salicidation process may then be used (TiSi, CoSi, etc., e.g.).

FIG. 10 is a cross-sectional representation of FIG. 9 along line 10—10 and illustrates upper gate 60 and lower gate 62 of poly gate 40 separated by patterned SOI silicon layer 14" and conformal oxide layer 32 thereover in the channel portion 24. Sidewall spacers 50 extend over the side walls 41 of upper gate 60 of poly gate 40. Sidewall spacers 52 extend over the side walls 43 of source 42' and sidewall spacers 54 extend over the side walls 45 of drain 44'.

FIG. 11 is a cross-sectional representation of FIG. 9 along line 11—11, perpendicular to line 10—10, and illustrates upper gate 60 and lower gate 62 of poly gate 40 separated by patterned SOI silicon layer 14" and conformal oxide layer 32 thereover in the channel portion 24. Sidewall spacers 50 extend over the side walls 41 of upper gate 60 of poly gate 40.

As noted above, the use of offset spacers 26 reduce the undercutting of SOI silicon oxide layer 12 which imparts a reduced gate to source-drain overlap capacitance to the double-gated SOI transistor 70 which provides for, inter alia, improved performance (speed) due to lower parasitic capacitance, which introduces extra delay due to capacitance charging/discharging Advantages of the Invention The advantages of one or more embodiments of the present invention include:
1) lower parasitic overlap performance; and
2) simple process—no new materials or new chemicals are required.

Some notable qualities of this invention include:
1) making use of the top and bottom surfaces of the SOI for gate oxide channel formation—due to the fact that both surfaces have low surface roughness, the mobility is improved;
2) gate oxide is formed all around the channel which is more like a circular FET rather than a planar FET; and
3) high-k materials like $HfSi_xO_2$ and $ZrO_2$ may be used as the gate oxide and W or WN may be used to form a metal gate instead of using polysilicon.

While particular embodiments of the present invention have been illustrated and described, it is not intended to limit the invention, except as defined by the following claims.

We claim:

1. A method of forming a double-gated transistor, comprising the sequential steps of:
   providing a substrate having an SOI structure formed thereover; the SOI structure including a lower SOI oxide layer and an upper SOI silicon layer;
   patterning the SOI silicon layer to form a patterned SOI silicon layer; the patterned SOI silicon layer including a source region and a drain region connected by a channel portion;
   forming an encasing oxide layer over the patterned SOI silicon layer to form an encased patterned SOI silicon layer;
   forming a patterned dummy layer over the encased patterned SOI silicon layer; the patterned dummy layer having an opening, with exposed side walls, exposing:
      the channel portion of the encased patterned SOI silicon layer; and
      portions of the upper surface of the SOI oxide layer;
   forming offset spacers over the exposed side walls of the patterned dummy layer opening;
   etching the SOI oxide layer while minimizing the undercut portions of the upper surface of the SOI oxide layer into the SOI oxide layer to form a minimal undercut portions; the minimizing undercutting process also removing the offset spacers and the encasing oxide layer over the channel portion of the patterned SOI silicon layer;
   forming a conformal oxide layer around the channel portion of the patterned SOI silicon layer;
   forming a gate within the patterned dummy layer opening; the gate including an upper gate above the patterned SOI silicon layer and a lower gate under the patterned SOI silicon layer; and
   removing the patterned dummy layer to form the double-gated transistor.

2. The method of claim 1, wherein the structure is a semiconductor substrate.

3. The method of claim 1, wherein the structure is comprised of silicon or germanium.

4. The method of claim 1, wherein the lower SOI oxide layer has a thickness of from about 1000 to 5000 Å; the upper SOI silicon layer has a thickness of from about 300 to 2000 Å; the encasing oxide layer has a thickness of from about 5 to 200 Å; the patterned dummy layer has a thickness of from about 1000 to 3000 Å; and the conformal oxide layer has a thickness of from about 5 to 200 Å.

5. The method of claim 1, wherein the lower SOI oxide layer has a thickness of from about 2000 to 4000 Å; the upper SOI silicon layer has a thickness of from about 500 to 1500 Å; the encasing oxide layer has a thickness of from about 10 to 50 Å; the patterned dummy layer has a thickness of from about 1500 to 2500 Å; and the conformal oxide layer has a thickness of from about 10 to 50 Å.

6. The method of claim 1, wherein the undercut portions are each from about 500 to 3000 Å deep.

7. The method of claim 1, wherein the undercut portions are each from about 1000 to 2000 Å deep.

8. The method of claim 1, wherein the undercut portions each protrude from about 0 to 2000 Å under the patterned dummy layer opening.

9. The method of claim 1, wherein the undercut portions each protrude from about 0 to 500 Å under the patterned dummy layer opening.

10. The method of claim 1, wherein the patterned dummy layer is comprised of nitride, silicon nitride or silicon oxynitride; and the gate is comprised of polysilicon, tungsten, $W-Si_x$ or aluminum.

11. The method of claim 1, wherein the patterned dummy layer is comprised of nitride; and the gate is comprised of polysilicon.

12. The method of claim 1, wherein the undercut portions are formed using a dilute HF etch and the patterned dummy layer is removed using hot phosphoric acid.

13. The method of claim 1, wherein the encasing oxide layer and the conformal oxide layer are each formed by a growth process.

14. The method of claim 1, including the step of forming source/drain implants into the respective source region and the drain region to form a source and a drain after removal of the patterned dummy layer.

15. The method of claim 1, including the step of performing:
   LDD implants; and
   source/drain implants
after removal of the patterned dummy layer.

16. The method of claim 1, wherein the upper gate has exposed side walls and including the step of forming spacers over the upper gate exposed side walls after removal of the patterned dummy layer.

17. The method of claim 1, including the further step of then performing a salicidation process.

18. A method of forming a double-gated transistor, comprising the sequential steps of:
   providing a substrate having an SOI structure formed thereover; the SOI structure including a lower SOI oxide layer and an upper SOI silicon layer;
   patterning the SOI silicon layer to form a patterned SOI silicon layer; the patterned SOI silicon layer including a source region and a drain region connected by a channel portion;
   forming an encasing oxide layer over the patterned SOI silicon layer to form an encased patterned SOI silicon layer;
   forming a patterned dummy layer over the encased patterned SOI silicon layer; the patterned dummy layer having an opening, with exposed side walls, exposing:
      the channel portion of the encased patterned SOI silicon layer; and
      portions of the upper surface of the SOI oxide layer;
   forming offset spacers over the exposed side walls of the patterned dummy layer opening;
   etching the SOI oxide layer while minimizing the undercut portions of the upper surface of the SOI oxide layer into the SO oxide layer to form a minimal undercut portions; the minimizing undercutting process also removing the offset spacers and the encasing oxide layer over the channel portion of the patterned SOI silicon layer; wherein the undercut portions each protrude from about 0 to 2000 Å under the patterned dummy layer opening;

forming a conformal oxide layer around the channel portion of the patterned SOI silicon layer;

forming a gate within the patterned dummy layer opening; the gate including an upper gate above the patterned SOI silicon layer and a lower gate under the patterned SOI silicon layer; and removing the patterned dummy layer to form the double-gated transistor.

19. The method of claim 18, wherein the structure is a semiconductor substrate.

20. The method of claim 18, wherein the structure is comprised of silicon or germanium.

21. The method of claim 18, wherein the lower SOI oxide layer has a thickness of from about 1000 to 5000 Å; the upper SOI silicon layer has a thickness of from about 300 to 2000 Å; the encasing oxide layer has a thickness of from about 5 to 200 Å; the patterned dummy layer has a thickness of from about 1000 to 3000 Å; and the conformal oxide layer has a thickness of from about 5 to 200 Å.

22. The method of claim 18, wherein the lower SOI oxide layer has a thickness of from about 2000 to 4000 Å; the upper SOI silicon layer has a thickness of from about 500 to 1500 Å; the encasing oxide layer has a thickness of from about 10 to 50 Å; the patterned dummy layer has a thickness of from about 1500 to 2500 Å; and the conformal oxide layer has a thickness of from about 10 to 50 Å.

23. The method of claim 18, wherein the undercut portions are each from about 500 to 3000 Å deep.

24. The method of claim 18, wherein the undercut portions are each from about 1000 to 2000 Å deep.

25. The method of claim 18, wherein the undercut portions each protrude from about 0 to 500 Å under the patterned dummy layer opening.

26. The method of claim 18, wherein the patterned dummy layer is comprised of nitride, silicon nitride or silicon oxynitride; and the gate is comprised of polysilicon, tungsten, W—$Si_x$ or aluminum.

27. The method of claim 18, wherein the patterned dummy layer is comprised of nitride; and the gate is comprised of polysilicon.

28. The method of claim 18, wherein the undercut portions are formed using a dilute HF etch and the patterned dummy layer is removed using hot phosphoric acid.

29. The method of claim 18, wherein the encasing oxide layer and the conformal oxide layer are each formed by a growth process.

30. The method of claim 18, including the step of forming source/drain implants into the respective source region and the drain region to form a source and a drain after removal of the patterned dummy layer.

31. The method of claim 18, including the step of performing:
LDD implants; and
source/drain implants
after removal of the patterned dummy layer.

32. The method of claim 18, wherein the upper gate has exposed side walls and including the step of forming spacers over the upper gate exposed side walls after removal of the patterned dummy layer.

33. The method of claim 18, including the further step of then performing a salicidation process.

34. A method of forming a double-gated transistor, comprising the sequential steps of:

providing a substrate having an SOI structure formed thereover; the SOI structure including a lower SOI oxide layer and an upper SOI silicon layer;

patterning the SOI silicon layer to form a patterned SOI silicon layer; the patterned SOI silicon layer including a source region and a drain region connected by a channel portion;

forming an encasing oxide layer over the patterned SOI silicon layer to form an encased patterned SOI silicon layer;

forming a patterned dummy layer over the encased patterned SOI silicon layer; the patterned dummy layer having an opening, with exposed side walls, exposing:
the channel portion of the encased patterned SOI silicon layer; and
portions of the upper surface of the SOI oxide layer;

forming offset spacers over the exposed side walls of the patterned dummy layer opening;

etching the SOI oxide layer while minimizing the undercut portions of the upper surface of the SOI oxide layer into the SO oxide layer to form a minimal undercut portions; the minimizing undercutting process also removing the offset spacers and the encasing oxide layer over the channel portion of the patterned SOI silicon layer; wherein the undercut portions are formed using a dilute HF etch;

forming a conformal oxide layer around the channel portion of the patterned SOI silicon layer;

forming a gate within the patterned dummy layer opening; the gate including an upper gate above the patterned SOI silicon layer and a lower gate under the patterned SOI silicon layer; and removing the patterned dummy layer using hot phosphoric acid to form the double-gated transistor.

35. The method of claim 34, wherein the structure is a semiconductor substrate.

36. The method of claim 34, wherein the structure is comprised of silicon or germanium.

37. The method of claim 34, wherein the lower SOI oxide layer has a thickness of from about 1000 to 5000 Å; the upper SOI silicon layer has a thickness of from about 300 to 2000 Å; the encasing oxide layer has a thickness of from about 5 to 200 Å; the patterned dummy layer has a thickness of from about 1000 to 3000 Å; and the conformal oxide layer has a thickness of from about 5 to 200 Å.

38. The method of claim 34, wherein the lower SOI oxide layer has a thickness of from about 2000 to 4000 Å; the upper SOI silicon layer has a thickness of from about 500 to 1500 Å; the encasing oxide layer has a thickness of from about 10 to 50 Å; the patterned dummy layer has a thickness of from about 1500 to 2500 Å; and the conformal oxide layer has a thickness of from about 10 to 50 Å.

39. The method of claim 34, wherein the undercut portions are each from about 500 to 3000 Å deep.

40. The method of claim 34, wherein the undercut portions are each from about 1000 to 2000 Å deep.

41. The method of claim 34, wherein the undercut portions each protrude from about 0 to 2000 Å under the patterned dummy layer opening.

42. The method of claim 34, wherein the undercut portions each protrude from about 0 to 500 Å under the patterned dummy layer opening.

43. The method of claim 34, wherein the patterned dummy layer is comprised of nitride, silicon nitride or silicon oxynitride; and the gate is comprised of polysilicon, tungsten, W—$Si_x$ or aluminum.

44. The method of claim 34, wherein the patterned dummy layer is comprised of nitride; and the gate is comprised of polysilicon.

45. The method of claim 34, wherein the encasing oxide layer and the conformal oxide layer are each formed by a growth process.

46. The method of claim 34, including the step of forming source/drain implants into the respective source region and the drain region to form a source and a drain after removal of the patterned dummy layer.

47. The method of claim 34, including the step of performing:

LDD implants; and source/drain implants after removal of the patterned dummy layer.

48. The method of claim 34, wherein the upper gate has exposed side walls and including the step of forming spacers over the upper gate exposed side walls after removal of the patterned dummy layer.

49. The method of claim 34, including the further step of then performing a salicidation process.

* * * * *